United States Patent
Honda et al.

(10) Patent No.: US 9,404,963 B2
(45) Date of Patent: Aug. 2, 2016

(54) APPARATUS AND METHOD FOR INSPECTING INFRARED SOLID-STATE IMAGE SENSOR

(71) Applicant: KABUSHIKI KAISHA TOSHIBA, Minato-Ku (JP)

(72) Inventors: Hiroto Honda, Yokohama (JP); Koichi Ishii, Kwasaki (JP); Hideyuki Funaki, Tokyo (JP); Keita Sasaki, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 484 days.

(21) Appl. No.: 14/064,588

(22) Filed: Oct. 28, 2013

(65) Prior Publication Data

US 2014/0132279 A1 May 15, 2014

(30) Foreign Application Priority Data

Nov. 12, 2012 (JP) .................. 2012-248682

(51) Int. Cl.
*G01R 31/00* (2006.01)
*G01R 31/28* (2006.01)
*G01R 31/26* (2014.01)

(52) U.S. Cl.
CPC ........ *G01R 31/2829* (2013.01); *G01R 31/2635* (2013.01)

(58) Field of Classification Search
CPC .......... G01R 31/2829; G01R 31/2635; G01R 31/282; G01R 31/2832; G01R 31/2836; G01R 31/2837; G01R 31/2839; G01R 31/26; G01R 31/2607; G01R 31/2632; G01J 5/10; G01J 5/20–5/26; H04N 5/30; H04N 5/33; H04N 5/332; H04N 5/335
See application file for complete search history.

(56) References Cited

U.S. PATENT DOCUMENTS 6,683,643 B1 * 1/2004 Takayama .............. H04N 5/367 348/247
6,982,412 B2 * 1/2006 Watson ................... H04N 5/33 250/252.1

(Continued)

FOREIGN PATENT DOCUMENTS

JP 2005260453 A * 9/2005
JP 2008268155 A * 11/2008

(Continued)

OTHER PUBLICATIONS

Hiroto Honda, et al., "A 320 x 240 pixel uncooled TEC-less infrared radiation focal plane array with the reset noise canceling algorithm", Proc. of SPIE, vol. 7660, 76600Z-1, 10 pages.

*Primary Examiner* — Tung X Nguyen
*Assistant Examiner* — David Frederiksen
(74) *Attorney, Agent, or Firm* — Oblon, McClelland, Maier & Neustadt, L.L.P.

(57) ABSTRACT

An apparatus includes: a current control unit to control an amount of constant current and supply a first and second constant currents to an infrared detection pixel; a constant current supply time control unit to control periods of time in which the first and second constant currents are supplied to the infrared detection pixel; an A-D converter to convert a first and second electrical signals from the infrared detection pixel into a first and second digital signals, the first and second electrical signals being generated when the first and second constant currents is supplied to the infrared detection pixel, respectively; a subtracting unit to calculate a difference between the first and second digital signals; and a determining unit to determine whether the infrared detection pixel is a defective pixel based on the absolute value of the difference calculated by the subtracting unit.

10 Claims, 6 Drawing Sheets

(56) References Cited

U.S. PATENT DOCUMENTS

| | | | |
|---|---|---|---|
| 2003/0025813 A1* | 2/2003 | Yoshiwara | H04N 5/2176 348/246 |
| 2004/0051798 A1* | 3/2004 | Kakarala | H04N 5/367 348/246 |
| 2007/0273294 A1* | 11/2007 | Nagayama | G09G 3/006 315/169.3 |
| 2009/0040343 A1* | 2/2009 | Kao | H04N 9/045 348/246 |
| 2011/0235775 A1* | 9/2011 | Tada | A61B 6/00 378/36 |
| 2012/0241613 A1 | 9/2012 | Ishii et al. | |
| 2013/0248714 A1 | 9/2013 | Honda et al. | |
| 2014/0063297 A1* | 3/2014 | Yamura | H04N 5/367 348/242 |

FOREIGN PATENT DOCUMENTS

| | | |
|---|---|---|
| JP | 2008306237 A * | 12/2008 |
| JP | 2011-171892 | 9/2011 |
| JP | 2012-47484 | 3/2012 |

* cited by examiner

APPARATUS AND METHOD FOR INSPECTING INFRARED SOLID-STATE IMAGE SENSOR

CROSS REFERENCE TO RELATED APPLICATIONS

This application is based upon and claims the benefit of priority from prior Japanese Patent Application No. 2012-248682 filed on Nov. 12, 2012 in Japan, the entire contents of which are incorporated herein by reference.

FIELD

Embodiments described herein relate generally to an apparatus and method for inspecting infrared solid-state image sensors.

BACKGROUND

As infrared rays can be generated from a heat source even in the dark and are more permeable to smoke and fog than visible light, infrared imaging can be performed at any time of the day or night. Temperature information about an object can be obtained through infrared imaging, and therefore, has a wide range of application, such as defense fields, surveillance cameras, and fire detecting cameras.

In recent years, "uncooled infrared solid-state image sensors" that do not require cooling mechanisms have been actively developed. In an infrared solid-state image sensor of an uncooled type or a heated type, an incident infrared ray of approximately 10 μm in wavelength is converted into heat by an absorption mechanism, and the temperature change in the heat sensing unit caused by the small amount of heat is then converted into an electrical signal by a thermoelectric converting means. The uncooled infrared solid-state image sensor obtains infrared image information by reading the electrical signal.

For example, a known infrared solid-state image sensor uses silicon pn junctions that convert temperature changes into voltage changes by applying a constant forward current. Using a SOI (Silicon on Insulator) substrate as a semiconductor substrate, such infrared solid-state image sensors can be mass-produced through a silicon LSI manufacturing process. Also, a row select function is realized by taking advantage of the rectifying properties of the silicon pn junctions serving as the thermoelectric converting means, so that the pixel structures can be dramatically simplified.

In the process of manufacturing infrared solid-state image sensors, hundreds to thousands of pixels out of 640×480 pixels might turn into defective (insensitive) pixels. In such pixels (defective pixels), information obtained by the pixels as image sensors is lost. Therefore, defective pixels need to be detected in an early stage of the manufacturing process.

There is a known method of determining a pixel address to replace a defective pixel address in a short period of time. By this method, however, inspection cannot be performed on infrared sensor chips or wafers. Infrared sensor chips need to be turned into a module through packaging, and a camera board or lens needs to be attached to the module to capture an image of an object. By this method, inspection is performed in the most downstream stage of the manufacture. As a result, throughput in the manufacture becomes lower, and production costs become higher.

DETAILED DESCRIPTION

There is provided with an apparatus for inspecting an infrared solid-state image sensor including at least one infrared detection pixel that generates an electrical signal in accordance with an incident infrared ray and an amount of supplied constant current, the apparatus including: a current control unit configured to control the amount of constant current and supply a first constant current and a second constant current to the infrared detection pixel, the first constant current and the second constant current being different from each other; a constant current supply time control unit configured to control periods of time in which the first and second constant currents are supplied to the infrared detection pixel; an A-D converter configured to convert a first electrical signal and a second electrical signal from the infrared detection pixel into a first digital signal and a second digital signal, respectively, the first electrical signal being generated when the first constant current is supplied to the infrared detection pixel, the second electrical signal being generated when the second constant current is supplied to the infrared detection pixel; a subtracting unit configured to calculate a difference between the first digital signal and the second digital signal; and a determining unit configured to determine whether the infrared detection pixel is a defective pixel based on the absolute value of the difference calculated by the subtracting unit.

The following is a description of embodiments of the present invention, with reference to the accompanying drawings.

Figure 1:
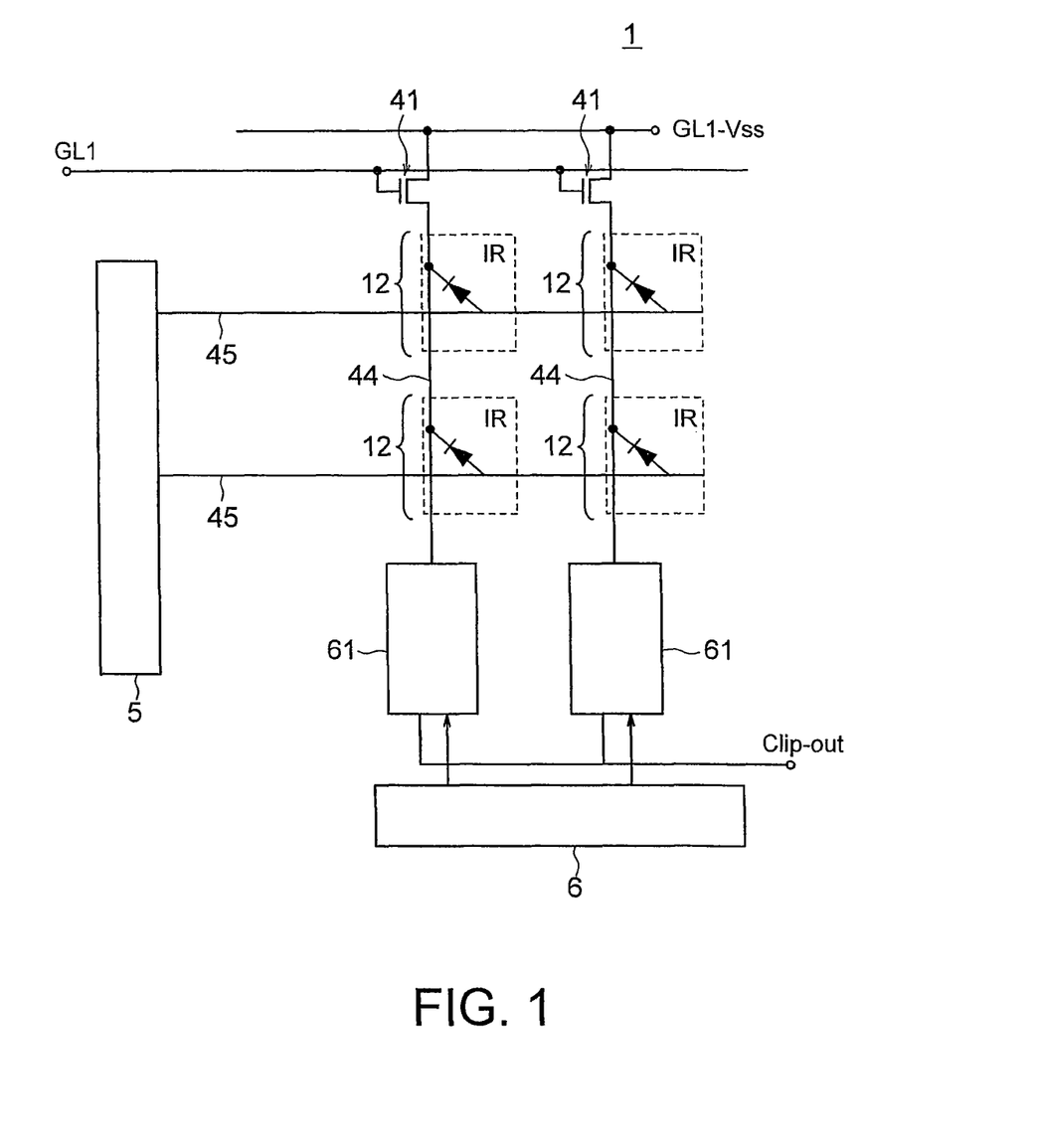
FIG. 1 is a diagram showing an infrared solid-state image sensor to be inspected by an inspection apparatus according to an embodiment.
Figure 2:
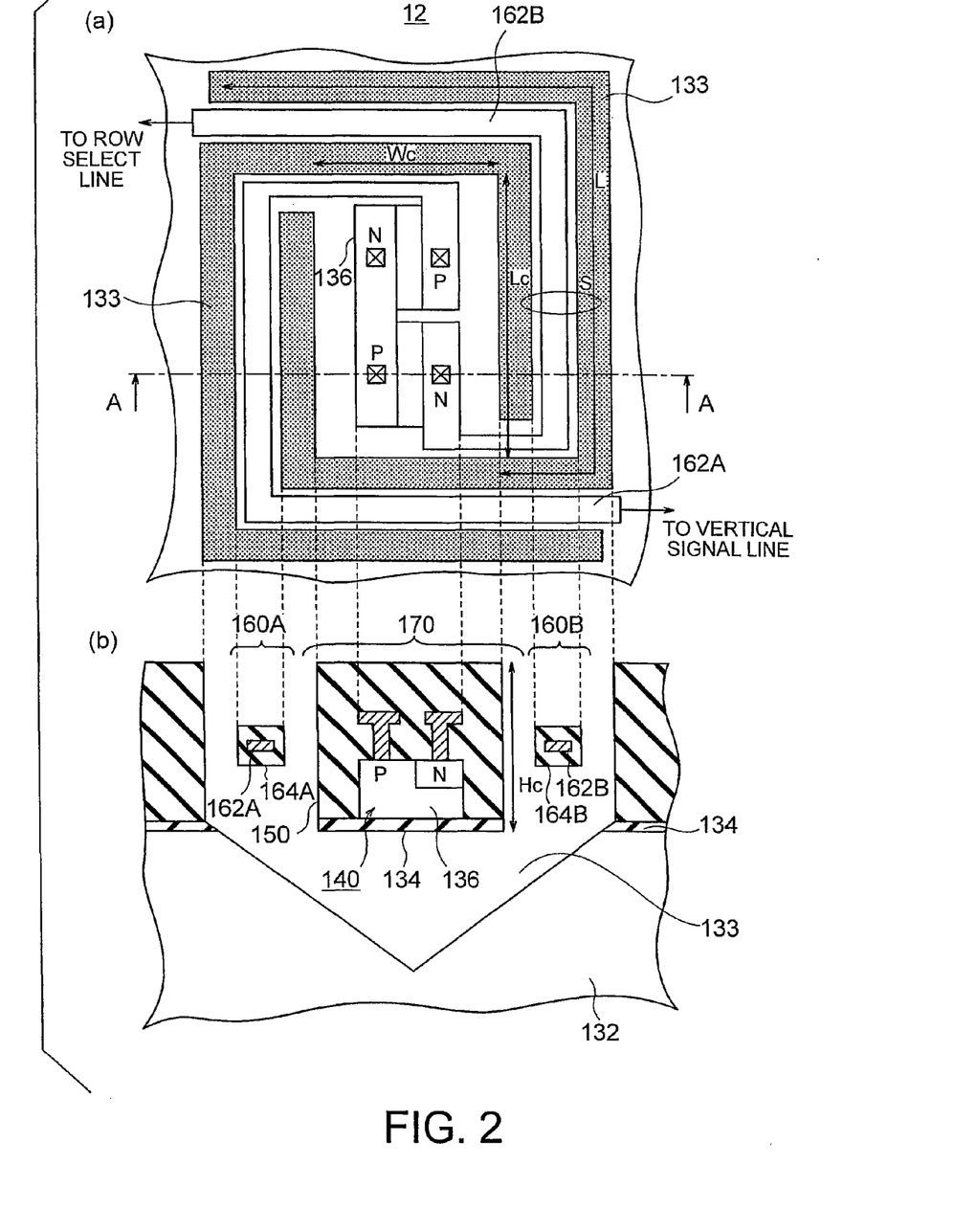
FIGS. 2(a) and 2(b) are a plan view and a cross-sectional view of an infrared detection pixel of the infrared solid-state image sensor.

Referring to FIGS. 1 through 8, an infrared solid-state image sensor inspection apparatus (hereinafter also referred to simply as the inspection apparatus) according to an embodiment is described. FIG. 1 shows an example of an infrared solid-state image sensor to be inspected by the inspection apparatus of this embodiment. FIG. 1 is a circuit diagram of an infrared solid-state image sensor 1. The infrared solid-state image sensor 1 includes an array structure including infrared detection pixels (hereinafter also referred to simply as pixels) 12 arranged on a semiconductor substrate, load transistors 41, column amplifiers 61, a row select circuit 5, and a column select circuit 6. An array structure normally includes a large number of pixels, but the array structure shown in FIG. 1 includes only 2×2 pixels, for ease of explanation. Each of the pixels includes a pn junction diode, and the structure of each of the pixels will be described later in detail.

Row select lines 45 connect the infrared detection pixels 12 arranged in the row direction. Vertical signal lines (hereinafter also referred to simply as signal lines) 44 connect the infrared detection pixels 12 arranged in the column direction. Each of the row select lines 45 is connected to one end (the anode side) of the pn junction diode of each corresponding infrared detection pixel 12, and each of the signal lines 44 is connected to the other end (the cathode side) of the pn junction diode of each corresponding infrared detection pixel 12. The row select lines 45 are connected to the row select circuit 5. The row select circuit 5 sequentially selects the infrared detection pixels 12 by the row via the row select lines 45, and applies a bias voltage $V_d$ to the infrared detection pixels 12.

The cathode side of the pn junction diode of each of the infrared detection pixels 12 is connected to the drain of the corresponding load transistor 41. Each of the load transistors 41 operates in a saturated region, and, in accordance with the gate voltage, supplies a constant current to the pixels 12 in the selected row. That is, each of the load transistors 41 functions as a constant current source. The source voltage of each of the load transistors 41 is represented by $V_{d0}$.

When the row select circuit 5 applies the bias voltage $V_d$ to the pn junction didoes of the pixels in the selected row, a series voltage $V_d$-$V_{d0}$ is applied to the pn junction diodes of the infrared detection pixels 12 in the selected row. Since all the pn junction diodes of the pixels in the unselected rows are inversely-biased, the row select lines 45 are separated from the signal lines 44. That is, the pn junction diodes have a pixel select function.

The potential of the signal lines 44 when infrared rays are not being received is defined as $V_{s1}$. The infrared detection pixels 12 each have the later described infrared absorption film. When the infrared absorption film receives an infrared ray, the pixel temperature becomes higher, and the potential of the pn junction diode forming the later described thermoelectric converting unit becomes higher. Accordingly, the potential $V_{s1}$ of the signal lines 44 becomes higher. For example, when the temperature of an object changes by 1 K (kelvin), the temperature of the infrared detection pixels 12 changes by approximately 5 mK. With the thermoelectric conversion efficiency of the infrared detection pixels 12 being 10 mV/K, the potential of the signal lines 44 increases by approximately 50 µV, which is much smaller than the bias voltage $V_d$. Such a minute change in the potential of the vertical signal lines 44 is amplified by the column amplifiers 61, and the column select circuit 6 including a horizontal shift register reads the amplified signals by the column. The read signals are output as serial video signals from the infrared sensor.

Where a signal that is read upon receipt of an infrared ray is $V_{sig}$, the potential of the vertical signal lines 44 is expressed as $V_d$-($V_{f0}$-$V_{sig}$-$V_{sh}$). Here, $V_{f0}$ represents the forward voltage of the pn junctions when no infrared rays are being received, and $V_{sig}$ is the voltage signal based on the temperature rise caused by infrared reception in the pn junction diodes. $V_{sh}$ represents the voltage change due to the Joule heat generated when current is applied to the pn junction diodes of the pixels. The self-heating amount $T_{cell}$ of a pn junction diode is expressed by the following equation (1).

$$T_{cell}(t) = \frac{I_f V_F}{G_{th}}\left\{1 - \exp\left(-\frac{t}{C_{th}/G_{th}}\right)\right\} \quad (1)$$

$$T_{cell}(t \to 0) = \frac{I_f V_f}{C_{th}} t \quad (2)$$

$$T_{cell}(t \to \infty) = \frac{I_f V_f}{G_{th}} t \quad (3)$$

Here, $I_f$ represents the amount of current determined by the operating point of the corresponding load transistor 41, $V_f$ represents the forward voltage of the pn junction diode, t represents the time elapsed since the current started flowing, and $C_{th}$ and $G_{th}$ represent the heat capacity and the heat conductance of the infrared detection pixel 12, respectively. Those values will be described later in detail. The equations (2) and (3) show values representing $T_{cell}$ obtained in cases where the current application time is sufficiently shorter and longer, respectively than the time constant $C_{th}/G_{th}$ (sec) in the equation (1).

The relationship between $I_f$ and $V_f$ of each infrared detection pixel 12 is expressed by the following equations (4) and (5).

$$I_f = A_0 T^{(3+\gamma/2)} \exp\left(-\frac{E_g}{kT}\right)\left[\exp\left(\frac{qV_f}{nkT}\right) - 1\right] \quad (4)$$

$$\frac{dV_f}{dT} \cong -\frac{nk}{q}\left\{-\ln(I_f) + \left(3 + \frac{\gamma}{2}\right)(\ln(T) + 1) + \ln(A_0)\right\} \quad (5)$$

Here, T represents temperature, $E_g$ represents the bandgap of the pn junction diode, k represents the Boltzmann constant, q represents the amount of elementary charge, n represents the number of pn junction diodes connected in series, and $A_0$ and γ are constants that do not depend on temperature.

As can be seen from the equation (4), $I_f$ monotonically increases, when regarded as a function of $V_f$. Likewise, $V_f$ monotonically increases, when regarded as a function of $I_f$. Since the right-hand value of the equation (5) is negative, $V_f$ monotonically decreases, when $I_f$ is fixed and $V_f$ is regarded as a function of T.

(Infrared Detection Pixels)

Referring now to FIGS. 2(a) and 2(b), the structure of each infrared detection pixel 12 of the infrared solid-state image sensor 1 is described. FIG. 2(a) is a plan view showing the structure of an infrared detection pixel 12, and FIG. 2(b) is a cross-sectional view of the infrared detection pixel 12, taken along the section line A-A defined in FIG. 2(a). The infrared detection pixel 12 includes a cell 170 that is formed on a SOI substrate including a supporting substrate 132, a buried insulating layer (hereinafter also referred to as the BOX layer) 134, and a SOI layer 136 made of single-crystal silicon. The cell 170 includes a thermoelectric converting unit 140 and an infrared absorption film 150 covering the thermoelectric converting unit 140. The infrared absorption film 150 generates heat with an incident infrared ray. The thermoelectric converting unit 140 is provided in the SOI layer 136, and includes pn junction diodes connected in series. The thermoelectric converting unit 140 converts the heat generated in the infrared absorption film 150 into an electrical signal.

The supporting substrate 132 has cavities 133 corresponding to the respective cells 170. Each of the cavities 133 is formed by removing part of the supporting substrate 132. The infrared detection pixel 12 includes supporting structures 160A and 160B that support the cell 170 above the corresponding cavity 133. The supporting structure 160A includes an interconnect 162A and an insulating film 164A coating the interconnect 162A. The supporting structure 160B includes an interconnect 162B and an insulating film 164B coating the interconnect 162B. The interconnect 162A has one end connected to the cathode of the thermoelectric converting unit 140, and has the other end connected to the corresponding vertical signal line. The interconnect 162B has one end connected to the anode of the thermoelectric converting unit 140, and has the other end connected to the corresponding row select line. Each of the supporting structures 160A and 160B is designed to have a long, thin shape so as to surround the thermoelectric converting unit 140. With this arrangement, the thermoelectric converting unit 140 is supported above the cavity 133, while thermally insulated from the SOI substrate. In this embodiment, each of the infrared detection pixels 12 includes the two supporting structures 160A and 160B, but may include only one supporting structure. In such a case, two interconnects are provided in the single supporting structure.

Having the above described structure, each of the infrared detection pixels 12 can accumulate heat that is generated in accordance with incident infrared rays, and output voltages to the corresponding vertical signal line 44 in accordance with the heat. The bias voltage $V_d$ from the corresponding row select line 45 is transmitted to the thermoelectric converting unit 140 via the interconnect 162B. The signal that has passed through the thermoelectric converting unit 140 is transmitted to the corresponding vertical signal line 44 via the interconnect 162A.

(Defective Pixels)

Figure 3:
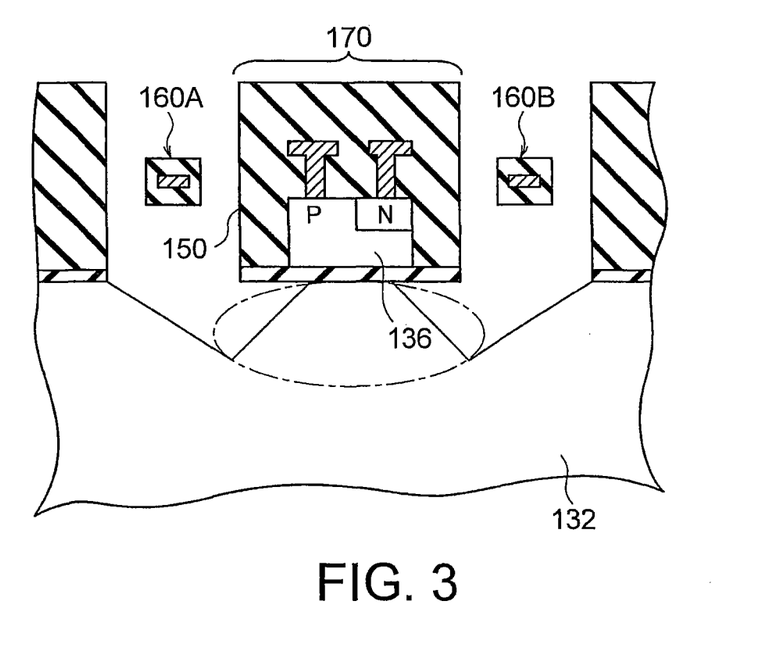
FIG. 3 is a cross-sectional view of a first specific example of a defective pixel.
Figure 4:
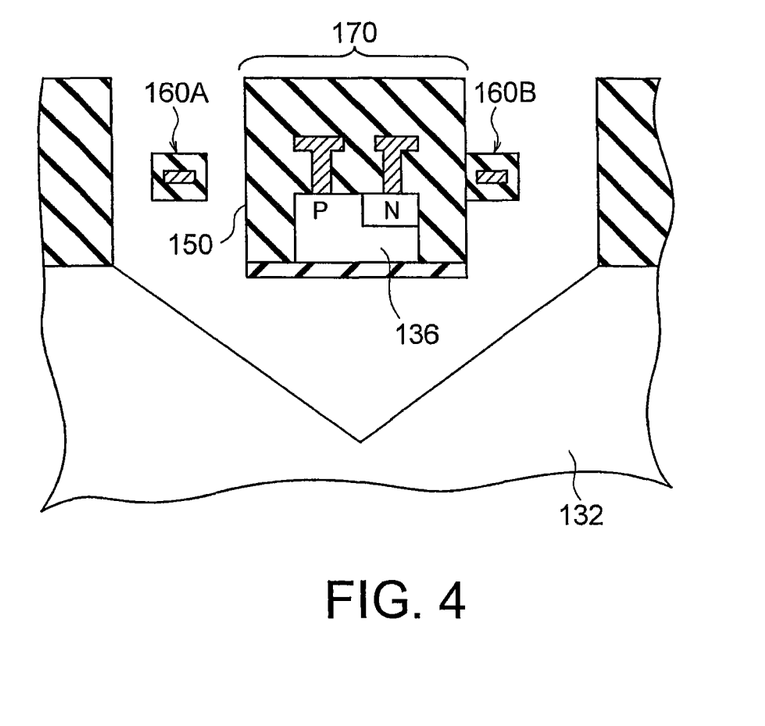
FIG. 4 is a cross-sectional view of a second specific example of a defective pixel.

Referring now to FIGS. 3 and 4, examples of defective pixels that do not have the functions of normal infrared detection pixels 12 are described.

FIG. 3 is a cross-sectional view of a first specific example of a defective pixel. The defective pixel of the first specific example differs from a normal infrared detection pixel 12 in that the cavity 133 is not properly formed below the thermoelectric converting unit 140 due to a manufacturing variation, and part of the supporting substrate 132 is in contact with the bottom portion of the pixel. In the defective pixel of the first specific example, the heat generated with incident infrared rays is smaller than that generated in a normal infrared detection pixel 12 by several digits, and therefore, can be ignored. That is, in the defective pixel of the first specific example, both the heat capacity $C_{th}$ and the heat conductance $G_{th}$, which are indicative of heat insulation properties, are much higher than those in a normal infrared detection pixel 12, and therefore, heat is not easily accumulated in the pixel but easily escapes from the pixel.

FIG. 4 is a cross-sectional view of a second specific example of a defective pixel. The defective pixel of the second specific example differs from a normal infrared detection pixel 12 in that at least one of the supporting structures 160A and 160B (the supporting structure 160B in FIG. 4) adheres to the cell 170 due to a manufacturing variation. In the defective pixel of the second specific example, heat insulation properties are degraded. That is, in the defective pixel of the second specific example, the heat conductance $G_{th}$, which is indicative of heat insulation properties, is much higher than that in a normal infrared detection pixel 12, and therefore, heat easily escapes from the pixel.

The heat conductance $G_{th}$ is indicative of the energy (W) that moves in a case where a heat conductor exists between two heat baths having a 1 K temperature difference in between. The heat conductance $G_{th}$ is expressed in the unit W/K. The heat conductance $G_{th}$ is expressed as $G_{th}=\kappa S/L$ (W/K) by using the heat conductivity $\kappa$ (W/K·m), the cross-sectional area S (m²), and the length L (m) of the supporting structures 160A and 160B, which perform heat conduction. Accordingly, as the cross-sectional area S becomes larger, and the length L becomes shorter, the heat conductance $G_{th}$ becomes higher. The heat conductivity $\kappa$ of the supporting structures 160A and 160B is determined by the interconnects 162A and 162B, and the insulating films 164A and 164B, which constitute the supporting structures 160A and 160B.

Meanwhile, the heat capacity $C_{th}$ is indicative of the energy (J) required for increasing the temperature of an object by 1 K, and is expressed in the unit J/K. The heat capacity $C_{th}$ is expressed as $C_{th}=c \cdot d \cdot V$ by using the specific heat c (J/kg) of the material, the volume V (m³) of the material, and the density d (kg/m³) of the material.

The heat conductance $G_{th}$_IMG and the heat capacity $C_{th}$_IMG of an infrared detection pixel 12 is expressed as:

$$G_{th}\_IMG = \kappa S/L + G_{th}\_AIR$$

$$C_{th}\_IMG = c \cdot d \cdot L_c W_c H_c \qquad (6)$$

Here, S represents the cross-sectional area of each supporting structure, L represents the length of each supporting structure, $L_c$ represents the length of the cell 170, $W_c$ represents the width of the cell 170, and $H_c$ represents the height of the cell. S, L, $L_c$, $W_c$, and $H_c$ are shown in FIGS. 2(a), and 2(b). $G_{th}$_AIR represents the heat conductance of the air existing in the space between the cell 170 and the silicon substrate 132.

The heat conductance $G_{th}$_DEFA and the heat capacity $C_{th}$_DEFA of the defective pixel of the first specific example illustrated in FIG. 3 is expressed as:

$$G_{th}\_DEFA = \kappa S/L + G_{th}\_SUB + G_{th}\_AIR$$

$$C_{th}\_DEFA = c \cdot d \cdot L_c W_c H_c \qquad (7)$$

Here, $G_{th}$_SUB represents the heat conductance at the portion surrounded by the dot-and-dash line in FIG. 3.

The heat conductance $G_{th}$_DEFA and the heat capacity $C_{th}$_DEFA of the defective pixel of the second specific example illustrated in FIG. 4 is expressed as:

$$G_{th}\_DEFA = \kappa S/L' + G_{th}\_AIR$$

$$C_{th}\_DEFA = c \cdot d \cdot L_c W_c H_c \qquad (8)$$

Here, L' represents the effective length of each of the supporting structures 160A and 160B. In a case where the supporting structure 160B is in contact with the cell 170 as shown in FIG. 4, the contact region forms a shortcut for heat. Therefore, L' is shorter than the effective length L of each of the supporting structures 160A and 160B in a normal infrared detection pixel 12 (L'<L).

Figure 5:
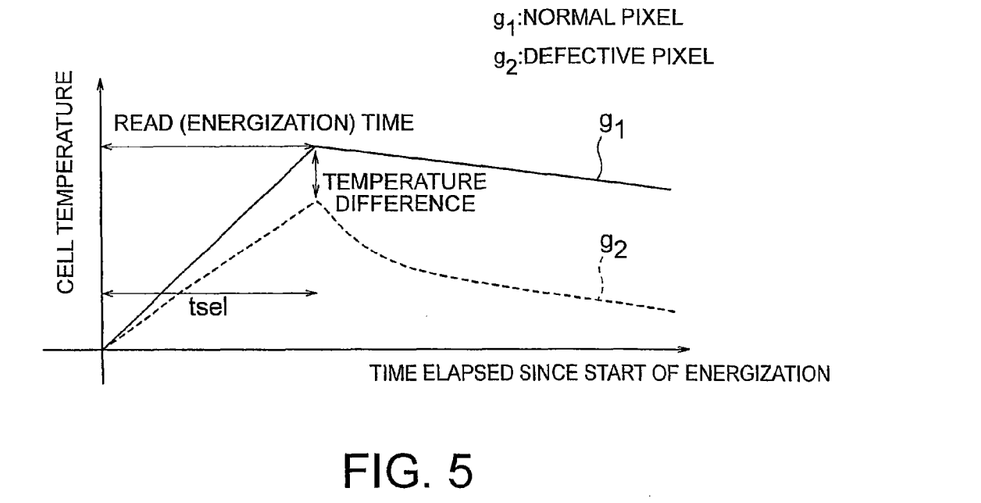
FIG. 5 is a diagram showing the self-heating temperature rising characteristics of a normal infrared detection pixel and the defective pixel of the first specific example.
Figure 6:
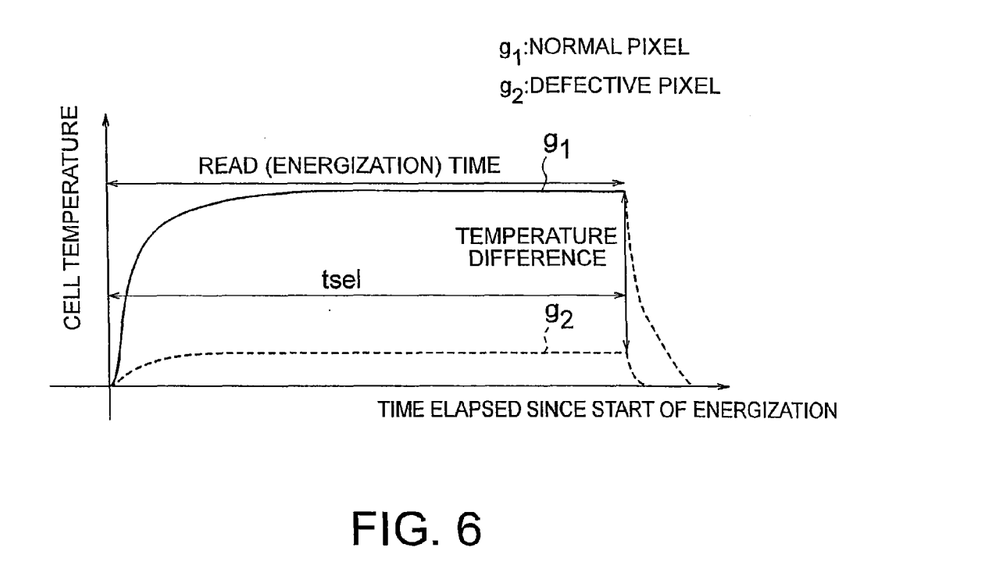
FIG. 6 is a diagram showing the self-heating temperature rising characteristics of a normal infrared detection pixel and the defective pixel of the second specific example.

FIG. 5 shows graphs indicating the amounts of self-heating in a normal infrared detection pixel 12 and the defective pixel of the first specific example having a large heat capacity $C_{th}$. FIG. 6 shows graphs indicating the amounts of self-heating in a normal infrared detection pixel 12 and the defective pixel of the second specific example having a high heat conductance $G_{th}$. In each of FIGS. 5 and 6, the amount of self-heating in the normal pixel is indicated by the solid-line graph $g_1$, and the amount of self-heating in the defective pixel is indicated by the dashed-line graph $g_2$. FIGS. 5 and 6 each show temporal changes in cell temperature rise in the time scale according to the equations (2) and (3). Specifically, time tsel is a very short period of time in the case illustrated in FIG. 5, while time tsel is a relatively long period of time in the case illustrated in FIG. 6. In both of the cases where the period of the constant current application to the selected pn junction diodes tsel is sufficiently shorter than the time constant $C_{th}/G_{th}$ (sec) in the equation (1) (the case illustrated in FIG. 5) and where the current application time tsel is sufficiently longer than the time constant $C_{th}/G_{th}$ (sec) (the case illustrated in FIG. 6), the defective pixels of the first specific example and the second specific example can be detected. The current application time tsel required for detecting defective pixels is 100 µsec in the case illustrated in FIG. 5, for example, and is approximately 400 msec in the case illustrated in FIG. 6, for example.

(Inspection Apparatus)

Figure 7:
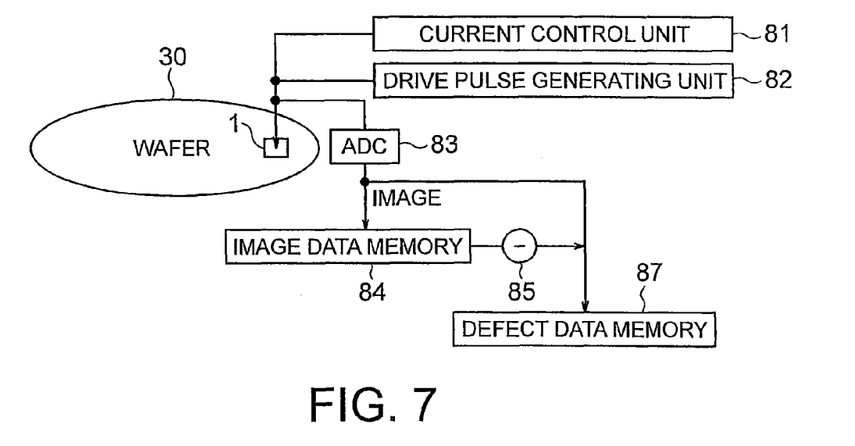
FIG. 7 is a block diagram of an inspection apparatus according to an embodiment.

FIG. 7 shows the structure of an inspection apparatus according to this embodiment. The inspection apparatus 80 inspects an infrared solid-state image sensor including at least one infrared detection pixel that generates an electrical signal in accordance with an incident infrared ray and the amount of a supplied constant current. The inspection apparatus 80 includes a current control unit 81, a drive pulse generating unit 82, an A-D converter 83, an image data memory 84, a subtracting circuit 85, and a defect data memory device 87. The infrared solid-state image sensors 1 to be inspected by the inspection apparatus 80 are formed in an array on a semiconductor substrate (a wafer) 30. At the time of inspection, the current control unit 81, the drive pulse generating unit 82, and the A-D converter 83 of the inspection apparatus 80 are temporarily connected to an infrared solid-state image sensor 1 on the semiconductor substrate 30. This connection is made with an inspection probe, for example.

The current control unit 81 can change the gate voltage GL1 of the load transistors 41 of the infrared solid-state image sensor 1 shown in FIG. 1. Since the load transistors 41 serve as the constant current sources for the infrared detection pixels 12, the constant currents to be applied to the infrared detection pixels 12 can be arbitrarily varied by changing the voltage GL1. Here, two current values $I_{f1}$ and $I_{f2}$ are set, for example. The drive pulse generating unit 82 generates a drive pulse, and, based on the pulse width of the drive pulse, determines the time for the row select circuit 5 to select a row. That is, the drive pulse generating unit 82 has the function of a constant current supply time control unit that controls the periods of time in which the above mentioned constant currents are supplied to the infrared detection pixels 12.

Figure 8:
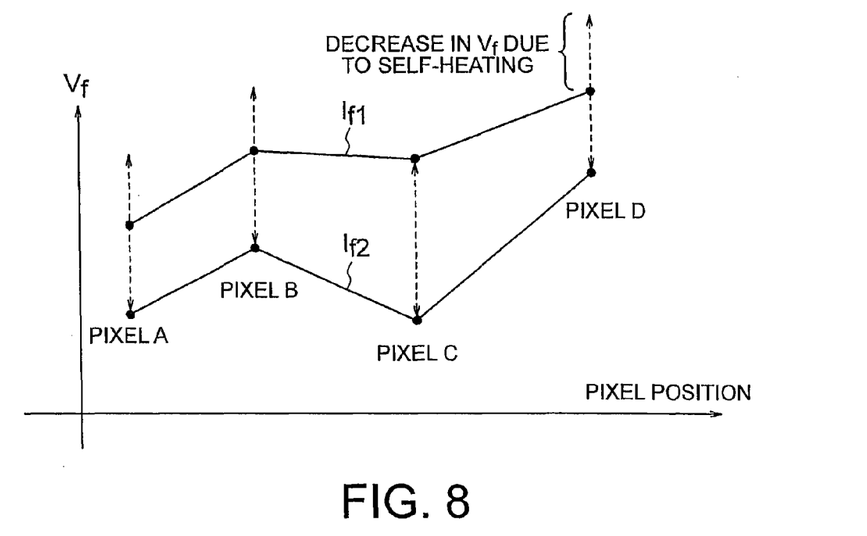
FIG. 8 is a diagram showing output voltage characteristics of infrared detection pixels at varying drive currents.

FIG. 8 shows the distribution of the values of the forward voltages $V_f$ of the pn junction diodes of respective infrared detection pixels 12 that receive infrared rays in a case where the drive currents for the infrared detection pixels 12 are varied from $I_{f1}$ to $I_{f2}$ ($<I_{f1}$). Pixels A, B, and D are infrared detection pixels, and a pixel C is the defective pixel of the first specific example illustrated in FIG. 3. At the same drive current, the pixel A, the pixel B, the pixel C, and the pixel D differ from one another in the voltage $V_f$. The reason for that is the variation in the characteristics of the pn junction diodes in the infrared detection pixels, or a physical defect as shown in FIG. 3 or 4. To eliminate the former reason, the voltage $V_f$ at the time of application of the drive current $I_{f2}$ is subtracted from the voltage $V_f$ at the time of application of the drive current $I_{f1}$ in each pixel. The results are that the difference voltages in the pixels A, B, and D are almost the same, but only the pixel C has a larger difference voltage than the others'. The difference voltage in the pixel C is shown by the dashed-line arrows on the graphs of the pixels A, B, and D. The difference voltages in the pixels A, B, and D are smaller than the difference voltage in the pixel C by the amount of decrease in the voltage $V_f$ caused by self-heating.

As described above, by comparing voltage values $V_f$ at different current values $I_f$ with one another, the influence of variation in the characteristics of the pn junction diodes can be eliminated, and defective pixels can be determined. Referring now to the flowchart shown in FIG. 9, the method of determining defective pixels is described.

Figure 9:
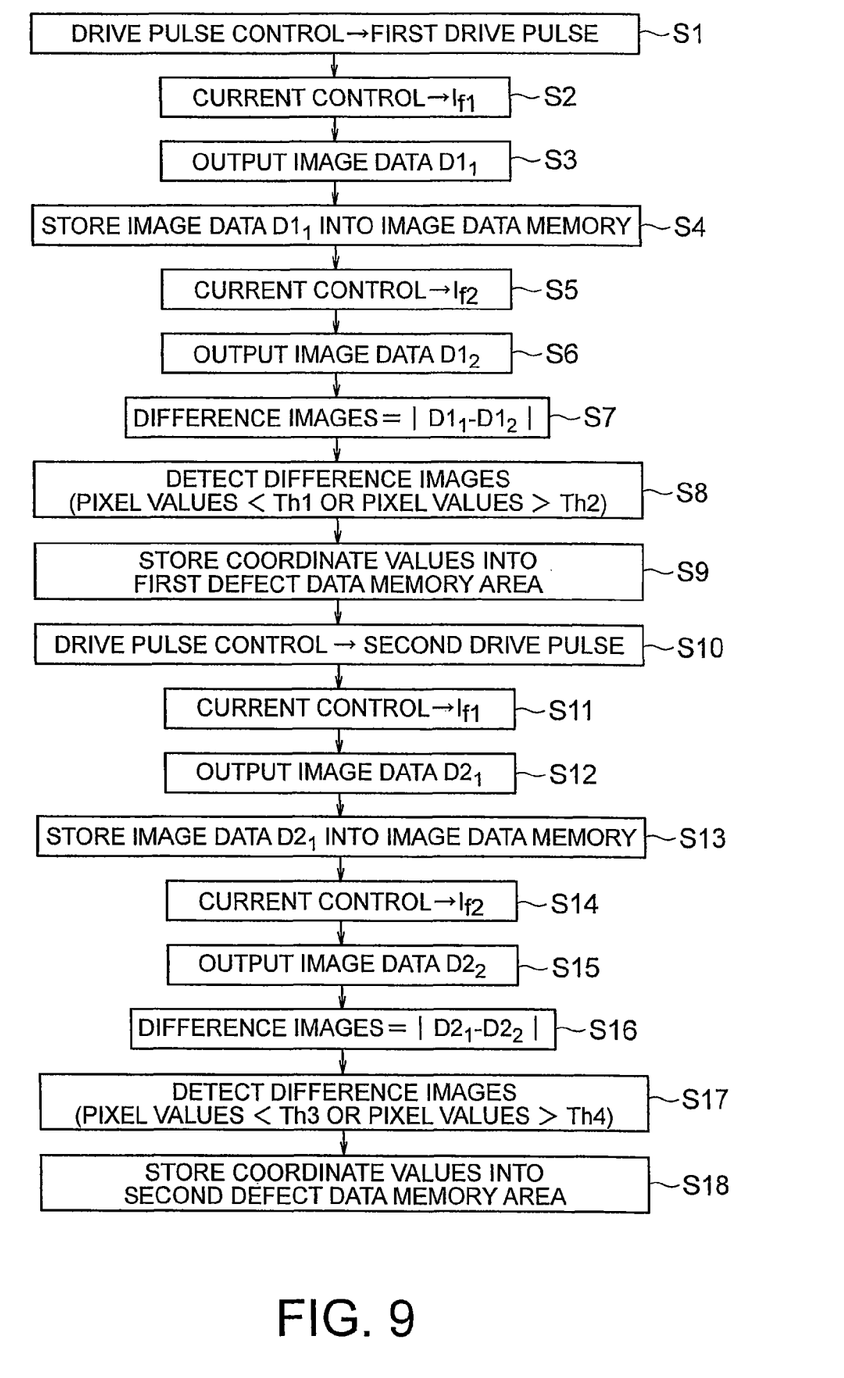
FIG. 9 is a flowchart showing the procedures according to an inspection method.

The drive pulse generating unit 82 generates a first drive pulse of a certain pulse width, such as 100 µsec, and the current control unit 81 applies the gate voltage GL1 of the load transistor 41 corresponding to the current $I_{f1}$, to an infrared solid-state image sensor 1 (steps S1 and S2). In such a situation, the infrared solid-state image sensor 1 outputs serial video signals. The A-D converter 83 converts the serial video signals into digital image data $D1_1$, and the image data $D1_1$ is temporarily stored into the image data memory 84 (steps S3 and S4).

The current control unit 81 then changes the current value from $I_{f1}$ to $I_{f2}$ (step S5). As a result, the output voltage of each infrared detection pixel changes as shown in FIG. 8, and accordingly, the serial video signals also change. The A-D converter 83 converts the serial video signals at this point into digital image data $D1_2$ (step S6).

The subtracting circuit 85 calculates the absolute values $|D1_1 - D1_2|$ of the differences between the stored image data $D1_1$ and the image data $D1_2$ (step S7). As a result, difference image data excluding variation in the characteristics of the pn junction diodes can be obtained.

The defect data memory device 87 detects pixel values that are smaller than a predetermined first threshold value Th1 or are larger than a predetermined second threshold value Th2 from the difference image data, and stores the coordinate values of the pixels having the detected pixel values into a first defect data memory area (steps S8 and S9). Where the image data is 16-bit data (0 through 65535), the first threshold value Th1 is set at 128, and the second threshold value Th2 is set at 4096, for example. A pixel having a larger difference value than the second threshold value Th2 is a pixel that has a small change in the voltage $V_f$ caused by self-heating in a short pulse as shown in FIG. 5, like the defective pixel of the first specific example. A pixel having a smaller difference value than the first threshold value Th1 is a pixel having the voltage $V_f$ that hardly changes even when the current $I_f$ is changed, or a defective pixel having a broken portion in an interconnect.

Further, the drive pulse generating unit 82 generates a second drive pulse of a certain pulse width, such as 400 msec, and the current control unit 81 applies the gate voltage GL1 of the load transistor 41 corresponding to the current $I_{f1}$, to the infrared solid-state image sensor 1 (steps S10 and S11). In such a situation, the infrared solid-state image sensor 1 outputs serial video signals. The A-D converter 83 converts the serial video signals into digital image data $D2_1$, and the image data $D2_1$ is temporarily stored into the image data memory 84 (steps S12 and S13).

The current control unit 81 then changes the current value from $I_{f1}$ to $I_{f2}$ (step S14). As a result, the output voltage of each infrared detection pixel changes as shown in FIG. 8, and accordingly, the serial video signals also change. The A-D converter 83 converts the serial video signals at this point into digital image data $D2_2$ (step S15).

The subtracting circuit 85 calculates the absolute values $|D2_1 - D2_2|$ of the differences between the stored image data $D2_1$ and the image data $D2_2$ (step S16). As a result, the difference images between the image data $D2_1$ at the current value $I_{f1}$ and the image data $D2_2$ at the current value $I_{f2}$ are generated.

The defect data memory device 87 detects, from the difference image data, the difference images having pixel values that are smaller than a predetermined third threshold value Th3 or are larger than a predetermined fourth threshold value Th4, and stores the coordinate values of the pixels having the detected pixel values into a second defect data memory area (steps S17 and S18). Where the image data is 16-bit data (0 through 65535), the third threshold value Th3 is set at 128, and the fourth threshold value Th4 is set at 4096, for example.

A pixel having a larger difference value than the fourth threshold value Th4 is a pixel that has a small change in the voltage $V_f$ caused by self-heating in a long pulse as shown in FIG. 6, like the defective pixel of the second specific example.

A pixel having a smaller difference value than the third threshold value Th3 is a pixel having the voltage $V_f$ that hardly changes even when the current $I_f$ is changed, or a defective pixel having a broken portion in an interconnect. As is apparent from the above explanation, the defect data memory device 87 includes a determining unit that determines whether an infrared detection pixel being inspected is a defective pixel.

According to this embodiment, defective pixels can be detected from a wafer or a chip by the above described method, and image quality can be improved without an increase in production costs or a decrease in throughput.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An apparatus for inspecting an infrared solid-state image sensor including at least one infrared detection pixel that generates an electrical signal in accordance with an incident infrared ray and an amount of supplied constant current, the apparatus comprising:
a current control unit configured to control the amount of constant current and supply a first constant current and a second constant current to the infrared detection pixel, the first constant current and the second constant current being different from each other;
a constant current supply time control unit configured to control periods of time in which the first and second constant currents are supplied to the infrared detection pixel;
an A-D converter configured to convert a first electrical signal and a second electrical signal from the infrared detection pixel into a first digital signal and a second digital signal, respectively, the first electrical signal being generated when the first constant current is supplied to the infrared detection pixel, the second electrical signal being generated when the second constant current is supplied to the infrared detection pixel;
a subtracting unit configured to calculate a difference between the first digital signal and the second digital signal; and
a determining unit configured to determine whether the infrared detection pixel is a defective pixel based on the absolute value of the difference calculated by the subtracting unit.

2. The apparatus according to claim 1, wherein the determining unit includes a checking unit configured to check whether the absolute value of the difference calculated by the subtracting unit is smaller than a first threshold value or is larger than a second threshold value, and determines that the infrared detection pixel is a defective pixel when the absolute value of the difference is smaller than the first threshold value or is larger than the second threshold value, the second threshold value being larger than the first threshold value.

3. The apparatus according to claim 1, wherein the constant current supply time control unit controls the periods of time, to supply the first and second constant currents to the infrared detection pixel for a first supply period and a second supply period, respectively, the second supply period being longer than the first supply period.

4. The apparatus according to claim 1, wherein the infrared solid-state image sensor includes a load transistor that has a gate to receive a control signal from the current control unit, has one end connected to a low current source, has the other end connected to the infrared detection pixel, and changes the amount of constant current in accordance with the control signal applied to the gate.

5. The apparatus according to claim 1, wherein
the infrared solid-state image sensor includes a row select circuit configured to select infrared detection pixels arranged in the same row, and a column select circuit configured to select infrared detection pixels arranged in the same column, and
the constant current supply time control unit determines time for the row select circuit to select a row.

6. The apparatus according to claim 1, wherein the infrared detection pixel includes a cell, the cell including an infrared absorption film configured to absorb an incident infrared ray and convert the incident infrared ray into heat, and a thermoelectric converting unit configured to convert the heat generated by the infrared absorption film into an electrical signal.

7. The apparatus according to claim 6, wherein the infrared detection pixel is formed on a semiconductor substrate having a cavity in a surface thereof, and further includes a supporting structure configured to support the cell above the cavity, the supporting structure including an interconnect for reading the electrical signal from the thermoelectric converting unit.

8. The apparatus according to claim 6, wherein the thermoelectric converting unit is a pn junction diode formed on single-crystal silicon.

9. A method for inspecting an infrared solid-state image sensor including at least one infrared detection pixel that generates an electrical signal in accordance with an incident infrared ray and an amount of supplied constant current, the method comprising:
supplying a first constant current and a second constant current to the infrared detection pixel, the first constant current and the second constant current being different from each other;
converting a first electrical signal and a second electrical signal from the infrared detection pixel into a first digital signal and a second digital signal, respectively, the first electrical signal being generated when the first constant current is supplied to the infrared detection pixel, the second electrical signal being generated when the second constant current is supplied to the infrared detection pixel;
calculating a difference between the first digital signal and the second digital signal; and
determining whether the infrared detection pixel is a defective pixel based on the absolute value of the calculated difference.

10. The method according to claim 9, further comprising controlling periods of time in which the first and second constant currents are supplied to the infrared detection pixel.

* * * * *